United States Patent [19]

Lacroix

[11] 4,166,983

[45] Sep. 4, 1979

[54] CIRCUIT FOR LIMITING THE OUTPUT VOLTAGE OF AN AMPLIFIER

[75] Inventor: Jean-Claude Lacroix, Longjumeau, France

[73] Assignee: Compagnie Industrielle des Telecommunications Cit-Alcatel, Paris, France

[21] Appl. No.: 920,897

[22] Filed: Jun. 29, 1978

[30] Foreign Application Priority Data

Jul. 21, 1977 [FR] France .................. 77 22354

[51] Int. Cl.² ............................................. H03F 3/04
[52] U.S. Cl. ................................. 330/297; 330/199; 330/207 P; 330/261; 330/296
[58] Field of Search .................. 330/199, 207 P, 261, 330/273, 296, 297

[56] References Cited

U.S. PATENT DOCUMENTS

| 3,725,676 | 4/1973 | Melchior | 330/297 X |
| 3,818,366 | 6/1974 | Arimura et al. | 330/207 P |
| 4,027,270 | 5/1977 | Pitel | 330/273 |
| 4,115,739 | 9/1978 | Sano et al. | 330/297 X |

*Primary Examiner*—Lawrence J. Dahl
*Attorney, Agent, or Firm*—Sughrue, Rothwell, Mion, Zinn and Macpeak

[57] ABSTRACT

A circuit permits the output voltage of an amplifier to be limited for certain ranges of its input voltage by causing the amplifier to saturate for said ranges of its input voltage by reducing the power supply.

The invention is applicable, for example, to eliminating or levelling the components of a signal whose amplitude lies within a certain range, without affecting any other components.

7 Claims, 4 Drawing Figures

CIRCUIT FOR LIMITING THE OUTPUT VOLTAGE OF AN AMPLIFIER

FIELD OF THE INVENTION

The present invention relates to electronic amplifiers.

BACKGROUND OF THE INVENTION

In certain applications it is necessary to limit the range of variation of the output voltage of an amplifier, and even to neutralise its output by bringing it to an arbitrary potential, for certain ranges of variations of its input signal. This is true particularly when it is desired to reduce or level the components of a signal whose amplitude lies within a certain range without affecting any other components. This situation may be encountered in various circumstances, and particularly when it is wished to avoid acting on a signal which, by its amplitude, indicates a malfunction of the circuit which generated it.

The present invention is intended to limit the output voltage of an amplifier and even to neutralise its output for certain ranges of variation in its input voltage.

SUMMARY OF THE INVENTION

The present invention provides a circuit for limiting the output voltage of an amplifier having two direct current supply terminals, one positive in relation to the other and called the positive supply terminal, the other called the negative supply terminal, and at least one signal input and one signal output, said limiting circuit comprising at least one two-state bias circuit connected into the supply circuit of the amplifier in series with one of the supply terminals and providing the bias voltage to that supply terminal, the bias voltage in a first state being at a first value which is that required by the amplifier for normal working, and the bias voltage in a second state being at a second value which is closer than the first value to the bias voltage at the other supply terminal, and a threshold detector whose input is connected in parallel with that of the amplifier and which controls the state of the bias circuit in such a way that the bias circuit is in its second state for a range of variations of the input signal to the amplifier which, with the amplifier normally supplied, produces an output signal having a potential between the first and second values.

Other characteristics and advantages of the invention will emerge from the attached claims and the description of two embodiments of the invention given hereinafter by way of example only. This description will be given by reference to the drawings.

DESCRIPTION OF THE PREFERRED EMBODIMENTS

Figure 1:
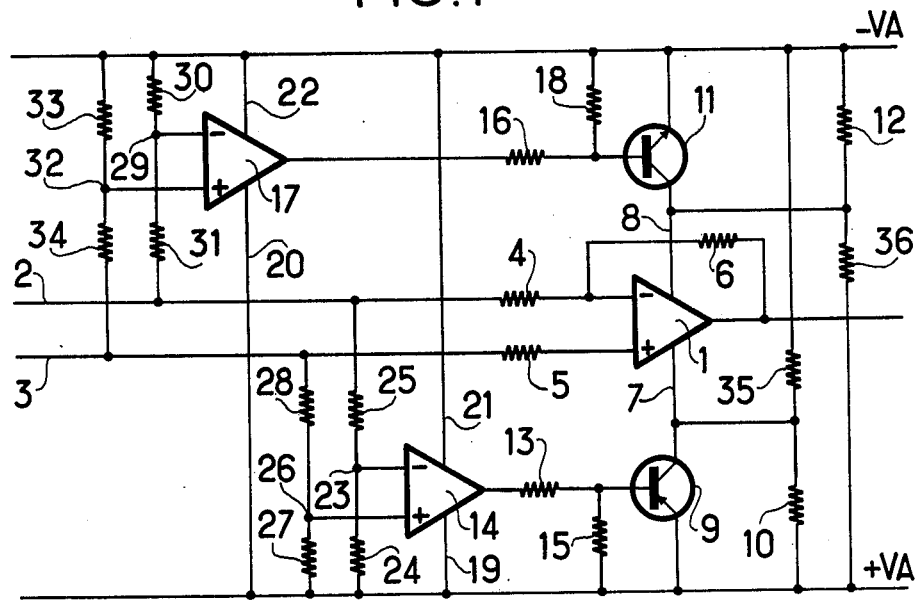
FIG. 1 is a diagram of a circuit which permits the variation of the output voltage of an amplifier to be limited at both ends of its range.

FIG. 1 shows an operational amplifier (1), having high gain, high input impedance, low output impedance, and two differential inputs (2) and (3). Resistances (4) and (5) connected in series in the input circuits (2) and (3) of the operational amplifier (1) and a feedback resistance (6) between the inverting input and the output of the amplifier (1) enable the gain of the amplifier to be adjusted. The operational amplifier (1) is biased by means of two supply terminals (7) and (8). Terminal (7) is positive relative to the other and is hereinafter called the positive supply terminal. Terminal 8 is called the negative supply terminal. The positive supply terminal (7) is connected to a source of positive voltage +VA by means of the emitter-collector junction of a transistor (9) and a resistance (10). The negative supply terminal (8) is connected to a source of negative voltage −VA by means of the collector-emitter junction of a transistor (11) and by a resistance (12). The PNP transistor (9) has its emitter connected to the +VA supply, its collector connected to the positive supply terminal (7) and its base connected by means of a resistance (13) to the output of a second operational amplifier (14) and by means of a resistance (15) to the +VA supply. The NPN transistor (11) has its emitter connected to the −VA supply, its collector connected to the negative supply terminal (8) and its base connected by means of a resistance (16) to a third operational amplifier (17) and by means of a resistance (18) to the −VA supply. The operational amplifiers (14) and (17) each have two supply terminals. One is positive (19 and 20) and is connected to the +VA supply, and the other is negative (21 and 22) and is connected to the −VA supply. Each has two differential inputs. The operational amplifier (14) has its inverting input (23) connected to the +VA supply by means of a resistance (24) and to the inverting input (2) of the operational amplifier (1) by means of a resistance (25). Its non-inverting input (26) is connected to the +VA supply by means of a resistance (27) and to the non-inverting input (3) of the operational amplifier (1) by means of a resistance (28). The operational amplifier (17) has its inverting input (29) connected to the −VA supply by means of a resistance (30) and to the inverting input (2) of the operational amplifier (1) by means of a resistance (31). Its non-inverting input (32) is connected to the −VA supply by means of a resistance (33) and to the non-inverting input (3) of the amplifier (1) by means of a resistance (34).

A resistance (35) connects the collector of the transistor (9) to the −VA supply and a resistance (36) connects the collector of the transistor (11) to the +VA supply.

The operational amplifier (1), its input resistances (4) and (5), and its feedback resistance (6) constitutes the amplifier whose output voltage is to be limited. The positive and negative volgage supplies +VA, −VA are chosen so as to permit normal (i.e., linear) working of the operational amplifier (1) over the range of variation of its input signal. By convention, the input signal Ve applied between the input terminals (2) and (3) of the circuit is defined as being the potential at the terminal (2) which is connected to the inverting input of the operational amplifier (1) relative to the potential at the terminal (3) which is connected to the non-inverting input of the operational amplifier (1). With this convention, the amplification circuit produced has an inverting effect, its output voltage varying inversely in relation of the input voltage Ve.

The operational amplifiers (14) and (17) operate as threshold detectors. The values of the resistances (24), (25), (27) and (28) in the input circuits of the operational amplifier (14) are calculated in the conventional manner so that the operational amplifier (14) switches over when the input signal Ve crosses the threshold S1. The values of the resistances (30), (31), (33) and (34) in the input circuits of the operational amplifier (17) are calculated so that it switches over when the input signal Ve crosses the threshold S2, which is higher than the threshold S1. As the operational amplifiers (14) and (17) have their inputs connected in parallel with the analogous inputs of the operational amplifier (1), their output voltage varies in the same direction as that of the operational amplifier (L). It is at the potential +VA so long as the input signal has not crossed the threshold, and otherwise at the potential −VA.

The transistor (9), the resistance (10) shunted across its emitter and its collector, and the resistance (35) connecting its collector to the −VA supply form a two-state bias circuit permitting the positive supply terminal (7) of the amplifier (1) to be brought to the potential +VA when the transistor (9) is saturated and to the potential V1 when the transistor (9) is cut off. The transistor (9) is saturated when the output of the operational amplifier (14) is at the potential −VA, i.e., when the input voltage Ve is greater in algebraic value than the threshold S1. The result is that the positive supply terminal (7) of the operational amplifier (1) is brought to the potential +VA when the input voltage Ve is greater than the threshold S1 and to the potential V1 when it is not. The potential V1 is basically determined by the values of the resistances (10) and (35). It is chosen lower than the output voltage of the operational amplifier (1) when it receives the threshold voltage S1 at its input and when it is normally supplied, its positive supply terminal (7) being at the potential +VA and its negative supply terminal being at the potential −VA. This results in the saturation of the operational amplifier (1) when its positive supply terminal changes from the potential +VA to the potential V1.

The transistor (11), the resistance (12) shunted across its emitter and its collector, and the resistance (36) connecting its collector the the +VA supply form another two-state bias circuit permitting the negative supply terminal (8) of the operational amplifier (1) to be brought to the potential −VA when the transistor (11) is saturated and to the potential V2 when the transistor 11 is cut off. The transistor (11) is saturated when the output of the operational amplifier (17) is at the potential +VA, i.e., when the input voltage Ve is lower in algebraic value than the threshold S2. As a result, the negative supply terminal (8) of the operational amplifier (1) is brought to the potential −VA when the input voltage Ve is lower in algebraic value than the threshold S2, and to the potential V2 when it is greater. The potential V2 is basically determined by the values of the resistances (22) and (36). It is chosen so as to be greater than the output voltage of the operational amplifier (1) when it is receiving the threshold voltage S2 at its input and when it is normally supplied. This results in the desaturation of the operational amplifier (1) when its negative supply terminal (8) changes from the potential −VA to the potential V2.

Figure 2:
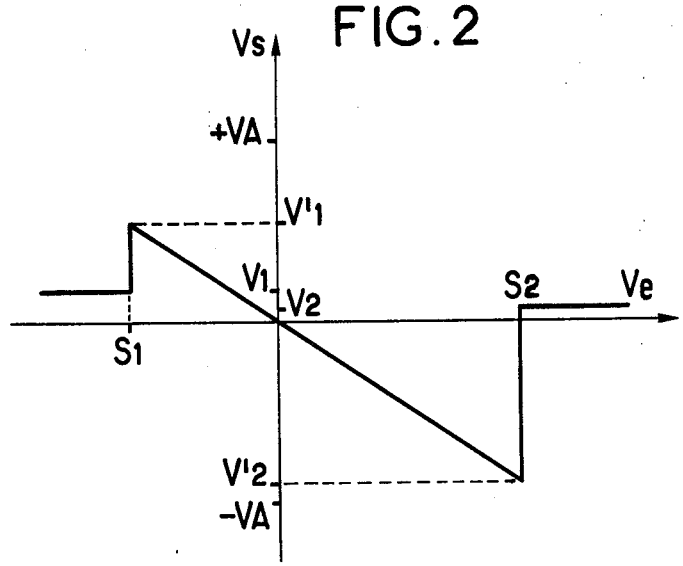
FIG. 2 is a curve showing the variations in the output voltage of the amplifier according to FIG. 1 as a function of its input voltage.

FIG. 2 is a curve showing the variations in the output voltage of the operational amplifier (1) as a function of that of the voltage Ve applied at its input.

When the input signal Ve of the operational amplifier (1) lies between the thresholds S1 and S2, its positive and negative supply terminals (7) and (8) are brought to the potentials +VA and −VA, respectively, and it is within its area of linear operation. The operational amplifier (14) receives an input voltage greater than its switchover threshold S1 and its output is brought to the potential −VA, which saturates the transistor (9) and biases the positive supply terminal (7) to +VA. The operational amplifier (17) receives an input voltage lower than its switchover threshold S2 and its output is at the potential +VA, which saturates the transistor (11) and biases the negative supply terminal 8 to −VA. Given the convention adopted for the definition of the input voltage Ve, the operational amplifier (1) behaves as an inverting amplifier and its output voltage Vs describes a negative slope straight line which goes from a voltage V'1 when the input voltage is equal to the threshold S1 to a voltage V'2 when the input voltage is equal to the threshold S2. This straight line passes through the origin since the voltages of the +VA and −VA supplies are symmetrical relative to earth. When the input signal Ve crosses the lower threshold S1, the operational amplifier (14) switches over, its output going to the potential +VA and cutting off the transistor (9), while the output of the operational amplifier (17) remains at +VA. For the operational amplifier (1) this means that its negative supply terminal (8) is maintained at the potential −VA and its positive supply terminal goes to the potential V1 which, by hypothesis, is lower than V'1. The operational amplifier (1) saturates and its output changes to a potential very close to V1. When the input signal Ve crosses the upper threshold S2, the operational amplifier (17) switches over and its output goes to the potential −VA, cutting off the transistor (11). The output of the operational amplifier (14) remains at the potential −VA. The positive supply terminal (7) of the operational amplifier (1) therefore remains at the potential +VA, while the negative supply terminal (8) changes to the potential V2. At this potential V2 is by hypothesis greater than the potential V'2, this saturates the operational amplifier (1), whose output goes to a potential close to V2.

It will be noted that the upper and lower limits of the range of variation of the output voltage of the operational amplifier are obtained separately by acting in the one case on the bias of the positive supply terminal (7) and in other cases on the bias of the negative terminal (8). It will also be noted that it is possible to produce limitation at only one end of the range by eliminating the threshold detector and the two-state bias circuit connected to one of them and biasing it directly from one of the IV ±VA supplies.

The voltage levels V1 and V2 should be chosen so as to have V1 in the interval V'1 to VA and V2 in the interval V'2 to +VA. V1 and V2 may be equal or different.

Figure 3:
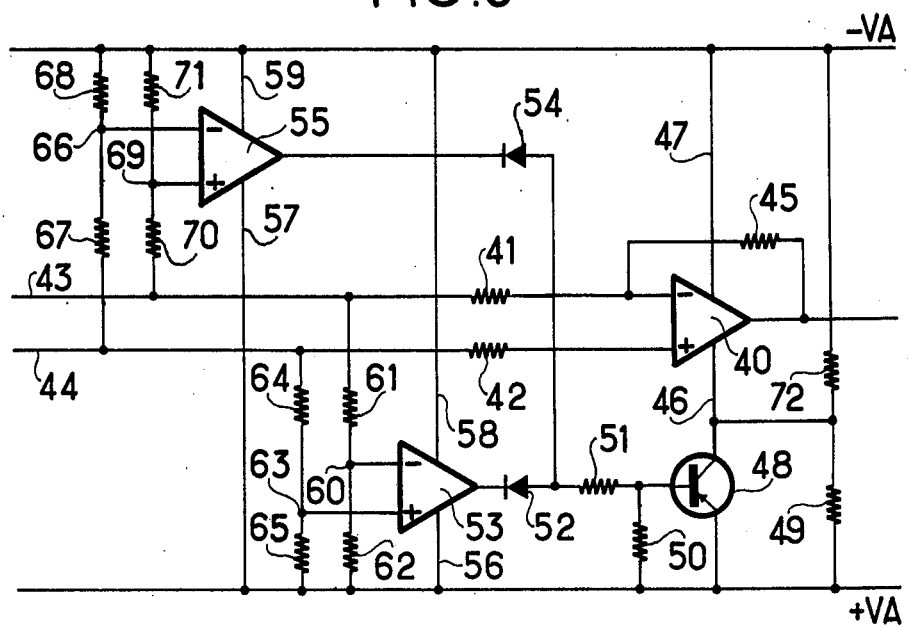
FIG. 3 is a diagram of a circuit which permits the output voltage of an amplifier to be neutralised over a central portion of the range of variation of its input signal.

FIG. 3 shows another type of circuit according to the invention permitting the neutralisation of the output of an amplifier within a certain area located in the centre of the range of variation of its output voltage.

FIG. 3 shows an operational amplifier (40) with differential inputs having two resistances (41) and (42) connected into its input circuits (43) and (44) and a feedback resistance (45) connected between its inverting input and its output. This operational amplifier (40) is biased by means of two supply terminals, (46) and (47), terminal (46) being positive in relation to terminal (47) and called the positive supply terminal, terminal (47) being called the negative supply terminal. The positive supply terminal (46) is connected to a source of positive voltage +VA by means of the emitter-collector junction of a transistor (48) and a resistance (49). The negative supply terminal (47) is connected directly to a source of negative voltage −VA. The PNP transistor (48) has its emitter connected to the +VA supply, its collector connected to the positive supply terminal (46) and its base connected by means of a resistance (50) to the +VA supply and by means of a resistance (51) in series with a diode (52) to the output of a second operational amplifier (52) and by means of the above-mentioned resistance (51) in series with another diode (54) to the output of a third operational amplifier (55). The operational amplifiers (53) and (55) each have two supply terminals, one positive (56 and 57, respectively) connected to the +VA supply, the other negative (58 and 59, respectively) connected to the −VA supply. They each have two differential inputs. The operational amplifier (53) has its inverting input (60) connected by means of a voltage divider comprising resistance (61), (62) between the inverting input (43) of the operational amplifier (40) and the +VA supply and its non-inverting input (63) connected by means of a voltage divider comprising resistances (54), (55) between the non-inverting input (44) of the operational amplifier (40) and the +VA supply. The operational amplifier (55) has its inverting input (66) connected by means of a voltage divider comprising resistances (67), (68) between the non-inverting input (44) of the operational amplifier (40) and the −VA supply, and its non-inverting input (69) connected by means of a voltage divider comprising resistances (70), (71) between the inverting input (43) of the operational amplifier (40) and the −VA supply. A resistance (72) connects the collector of the transistor (48) to the −VA supply.

The operational amplifier (40), its input resistances (41), (42) and the feedback resistance (45) constitute a conventional amplifier whose output is to be neutralised when the amplitude of its input signal lies within a certain area in the centre of its range of variation. As previously, the input signal Ve is by convention defined as being the potential at the input terminal (43) which is connected to the inverting input of the operational amplifier (40) relative to that at the input terminal (44) which is connected to the non-inverting input of the operational amplifier (40). With this convention, the amplifying circuit has an inverting effect, its output voltage varying inversely in relation to its input voltage. The +VA and −VA supply voltages are selected so as to permit normal functioning of the operational amplifier (40) i.e., linear operation over the range of variation of the input signal Ve when its positive and negative supply terminals (46) and (47) are actually connected to it.

The transistor (48), the resistance (49) shunted across its emitter-collector junction, and the resistance (72) connecting its collector to the −VA supply constitute a two-state bias circuit permitting the positive supply terminal (46) of the operational amplifier (40) to be brought either to the potential +VA when the transistor (48) is saturated, or to the potential V3 when the transistor (48) is cut off, the potential V3 being basically determined by the values of the resistances (49) and (72).

The transistor (48) is controlled by means of the diodes (52) and (54) which form an "OR" gate isolating the outputs of the operational amplifiers (53) and (55). Their anodes are connected to the outputs of the operational amplifiers (53) and (55) in such a way that the PNP transistor (48) is saturated as soon as one of the outputs of the operational amplifiers (53) and (55) goes to to the potential −VA. When the two outputs of the operational amplifiers (53) and (55) are at the potential +VA, the transistor (48) is cut off by means of the resistance (50) which connects its base to the +VA supply.

The operational amplifiers (53) and (55) operate as threshold detectors. They have different thresholds, S1 for the operational amplifier (53) and S2 for the operational amplifier (55), S1 being greater than S2. The threshold S1 is defined in the conventional way by the values of the resistances (61), (62), (64) and (65) in the input circuit of the operational amplifier (53). Since the latter has its inputs connected in parallel with the analogous inputs of the operational amplifier (40), its output voltage varies in the same direction as that of operational amplifier (40). It is at the potential +VA so long as the input voltage Ve does not cross the threshold S1 and at the potential −VA if it does cross that threshold. The threshold S2 is defined by the values of the resistances (67), (68), (70) and (71) in the input circuit of the operational amplifier (55). This operational amplifier (55) has its inverting input (66) connected to the non-inverting input (44) of the operational amplifier (40) and its non-inverting input (69) connected to the inverting input (43) of the operational amplifier (40). As a result its output voltage varies inversely with that of the operational amplifier (40). It is at the potential −VA so long as the input voltage Ve does not cross the threshold S2 and at the potential +VA if it does cross that threshold.

Figure 4:
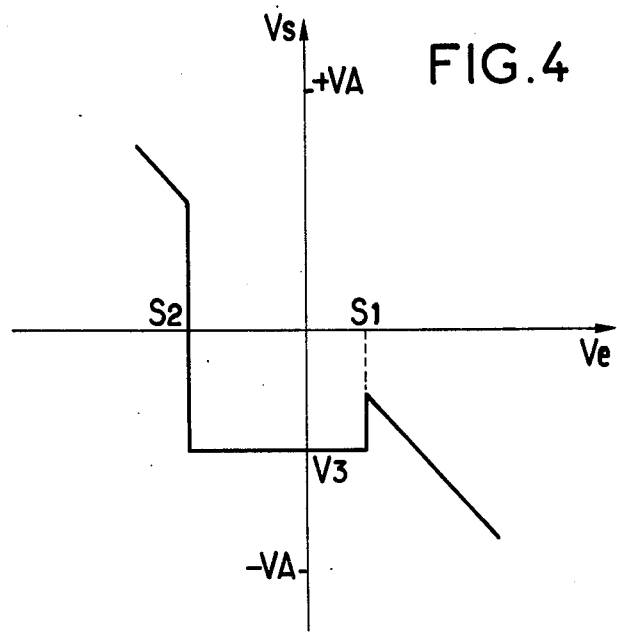
FIG. 4 is a curve showing the variations in the output voltage of the amplifier according to FIG. 3 as a function of its input voltage.

FIG. 4 is a curve showing the variations in the output voltage Vs of the operational amplifier (40) as a function of the input voltage Ve.

When the input signal Ve of the operational amplifier (40) is greater than the threshold S1, the positive supply terminal (46) of the operational amplifier (40) is brought to the potential +VA and the amplifier operates in the linear region. The output of the operational amplifier (53) is at a potential −VA and saturates the transistor (48) by means of the diode (52). The same applies when the input signal Ve is lower than the threshold S2, because the operational amplifier (55), whose output is at the potential −VA, saturates the transistor (48) by means of the diode (54). As a result, outside the interval S1, S2, the operational amplifier (40) operates in a linear manner. Given the convention adopted for the direction of the input signal Ve, it behaves as an inverting amplifier and its output voltage describes two segments of the same negative slope straight line. This straight line passes through the origin since the voltages of the +VA and −VA supplies are symmetrical in relation to earth.

When the input signal Ve lies between the thresholds S1 and S2, the outputs of the operational amplifiers (53) and (54) are both at the potential +Va, which cuts off the transistor (48) and brings the positive supply terminal (46) of the operational amplifier (40) to the potential V3. The potential V3 basically depends on the values of the resistances (49) and (72), and is chosen so as to be lower than any possible value of the output signal of the operational amplifier (40) if its input signal moved between the thresholds S1 and S2 and if its positive supply terminal (46) remained at the potential +VA. By reason of this choice, the switching of the positive supply terminal (46) to the potential V3 saturates the operational amplifier (40), whose output is maintained at a potential close to V3.

In the above example, the voltage V3 at which the amplifier output is neutralised when the input signal $V_e$ lies between the threshold S1 and S2, is lower than that which the amplifier output would assume in the absence of neutralisation. If this voltage V3 is to be greater than that which the amplifier output would assume in the absence of neutralisation, it is necessary to operate on the negative supply terminal (47) rather than on the positive supply terminal (46).

Without departing from the scope of the present invention, it is possible to modify certain arrangements or replace certain means by equivalent means. In particular, in the circuits shown in FIGS. 1 and 3 it is possible to replace the resistances shunted across the emitter-collector junction of the transistors by another type of impedance and to eliminate the resistance in series with them between the +VA and −VA supplies.

I claim:

1. A circuit for limiting the output voltage of an amplifier having two direct current supply terminals, one positive in relation to the other and called the positive supply terminal and the other called the negative supply terminal, and at least one signal input and one signal output, said limiting circuit comprising at least one two-state bias circuit connected into the supply circuit of the amplifier in series with one of the supply terminals and providing the bias voltage to that supply terminal, the bias voltage in a first state being at a first value which is that required by the amplifier for normal working, and the bias voltage in a second state being at a second value which is closer than the first value to the bias voltage at the other supply terminal, and a threshold detector whose input is connected in parallel with that of the amplifier and which controls the state of the bias circuit in such a way that the bias circuit is in its second state for a range of variation of the input signal to the amplifier which, with the amplifier normally supplied, produces an output signal having a potential between the first and the second values.

2. A circuit according to claim 1, comprising a first two-state bias circuit connected into the power supply of the amplifier in series with the positive supply terminal, a second two-state bias circuit connected into the power supply of the amplifier in series with the negative supply terminal, a first threshold detector whose input is connected in parallel with an input of the amplifier and which controls the state of the first bias circuit, and a second threshold detector whose input is connected in parallel with an input of the amplifier and which controls the state of the second bias circuit.

3. A circuit according to claim 1, comprising a two-state bias circuit connected into the power supply of the amplifier in series with the positive supply terminal and providing the bias voltage for said terminal, the bias voltage in a first state being at the value required by the amplifier for normal functioning and the bias voltage in a second state being at a second value more negative than the normal value but positive in relation to that of the bias voltage at the negative supply terminal, and a threshold detector which has its input connected to an input of the amplifier and which controls the state of the bias circuit in such a way that the latter assumes its second state for ranges of variation of the signal at the input of the amplifier which, when normally supplied, produces an output signal having a bias greater than said second value.

4. A circuit according to claim 1, comprising a two-state bias circuit connected into the power supply of the amplifier in series with the negative supply terminal and providing the bias voltage to siad terminal, the bias voltage in a first state being at the value required by by the amplifier for normal functioning and the bias voltage in a second state being at a second value more positive than the previous value but negative in relation to the bias voltage at the positive supply terminal, and a threshold detector whose input is connected to an input of the amplifier and which controls the state of the bias circuit in such a way that it assumes its second state for ranges of variation of the signal at the input of the amplifier which, when normally supplied, produces an output signal having a bias lower than said value.

5. A circuit according to claim 1, wherein said two-state bias circuit consists of an impedance connected into the power supply of the amplifier in series with the positive or the negative supply terminals and a semiconductor switch in parallel with said impedance and controlled by the threshold detector.

6. A circuit according to claim 5, wherein said impedance is a resistance.

7. A circuit according to claim 1, comprising a two-state bias circuit connected into the power supply of the amplifier in series with the positive or the negative supply terminal and two thresholds detectors having different thresholds whose inputs are connected in parallel with an input of the amplifier and whose outputs are linked by a diode "OR" circuit and control the two state bias circuit.

* * * * *